US011178798B2

(12) United States Patent
Knauer

(10) Patent No.: US 11,178,798 B2
(45) Date of Patent: Nov. 16, 2021

(54) COOLING SYSTEM WITH PARALLEL COOLING CHANNELS, TEMPERATURE SENSOR, AND MOVABLE FLAPS

(71) Applicant: Siemens Aktiengesellschaft, Munich (DE)

(72) Inventor: Hans Knauer, Leutenbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/767,015

(22) PCT Filed: Nov. 2, 2018

(86) PCT No.: PCT/EP2018/080019
§ 371 (c)(1),
(2) Date: May 26, 2020

(87) PCT Pub. No.: WO2019/101494
PCT Pub. Date: May 31, 2019

(65) Prior Publication Data
US 2021/0037682 A1 Feb. 4, 2021

(30) Foreign Application Priority Data
Nov. 27, 2017 (EP) .................................... 17203775

(51) Int. Cl.
*H05K 7/20* (2006.01)
(52) U.S. Cl.
CPC ................................ *H05K 7/20918* (2013.01)
(58) Field of Classification Search
CPC .......... H05K 7/20909–20918; H05K 7/20145; H05K 7/20163; H05K 7/20181;
(Continued)

(56) References Cited

U.S. PATENT DOCUMENTS 5,091,823 A * 2/1992 Kanbara ................. H02M 5/44
174/351
8,243,447 B2 * 8/2012 Fujiki ................ H05K 7/20918
361/695
(Continued)

FOREIGN PATENT DOCUMENTS

CN 101202529 A 6/2008
CN 102246612 A 11/2011
(Continued)

OTHER PUBLICATIONS

PCT International Search Report and Written Opinion of International Searching Authority dated Feb. 4, 2019 corresponding to PCT International Application No. PCT/EP2018/080019 filed Feb. 2, 2018.

*Primary Examiner* — Zachary Pape
(74) *Attorney, Agent, or Firm* — Henry M. Feiereisen LLC

(57) ABSTRACT

A cooling system for a power converter includes a first cooling channel configured to form an air channel, and a second cooling channel configured to form an air channel. The first and second cooling channels have at least one section in which the first and second cooling channels extend in a parallel arrangement in which the first cooling channel cools semiconductors of the power converter and the second cooling channel cools intermediate circuit capacitors of the power converter An air distributor is provided to divide an air stream between the first cooling channel and the second cooling channel in a ratio in a range of 80:20 to 95:5 as a function of a measurement value generated by a temperature sensor.

11 Claims, 3 Drawing Sheets

(58) Field of Classification Search
CPC .. H05K 7/20136–2019; H05K 7/20945; H01L 23/36–4735
See application file for complete search history.

(56) References Cited

U.S. PATENT DOCUMENTS

| | | | | |
|---|---|---|---|---|
| 8,325,479 | B2* | 12/2012 | Siracki | H05K 7/20918 361/679.5 |
| 9,433,123 | B2* | 8/2016 | Schroedl | H05K 7/20918 |
| 9,949,413 | B2* | 4/2018 | Wang | H05K 7/20209 |
| 2010/0025022 | A1* | 2/2010 | Tien | G06F 1/20 165/121 |
| 2010/0195284 | A1 | 8/2010 | Zheng | |
| 2010/0202109 | A1* | 8/2010 | Zheng | H05K 7/20918 361/697 |
| 2010/0265659 | A1 | 10/2010 | Silvennoinen et al. | |
| 2011/0198064 | A1 | 8/2011 | Smalen et al. | |
| 2011/0235276 | A1 | 9/2011 | Hentschel et al. | |
| 2012/0129440 | A1 | 5/2012 | Kitaguchi et al. | |
| 2013/0039008 | A1 | 2/2013 | Hofmann et al. | |
| 2013/0146254 | A1 | 6/2013 | Jeon et al. | |
| 2013/0242504 | A1* | 9/2013 | Cartes | G05D 23/1931 361/679.49 |
| 2014/0198453 | A1 | 7/2014 | Zhang et al. | |
| 2016/0174413 | A1* | 6/2016 | Steinbrecher | H05K 7/20727 361/679.51 |
| 2017/0135251 | A1 | 5/2017 | Hofmann et al. | |

FOREIGN PATENT DOCUMENTS

| | | |
|---|---|---|
| CN | 103140116 A | 8/2013 |
| CN | 106253635 A | 12/2016 |
| CN | 106604618 A | 4/2017 |
| EP | 2244361 A2 | 10/2010 |
| EP | 2254400 A2 | 11/2010 |
| EP | 2557676 A1 | 2/2013 |
| KR | 20130065390 A | 6/2013 |
| RU | 2465152 C2 | 10/2012 |
| RU | 2496658 C1 | 10/2013 |
| RU | 2562699 C1 | 9/2015 |

\* cited by examiner

COOLING SYSTEM WITH PARALLEL COOLING CHANNELS, TEMPERATURE SENSOR, AND MOVABLE FLAPS

CROSS-REFERENCES TO RELATED APPLICATIONS

This application is the U.S. National Stage of International Application No. PCT/EP2018/080019, filed Nov. 2, 2018, which designated the United States and has been published as International Publication No. WO 2019/101494 A1 and which claims the priority of European Patent Application, Serial No. 17203775.6, filed Nov. 27, 2018, pursuant to 35 U.S.C. 119(a)-(d).

BACKGROUND OF THE INVENTION

The invention relates to a cooling system for a power converter. The invention further relates to a power converter with a cooling system of this kind. Furthermore, the invention relates to a method for regulating and/or controlling a cooling system of this kind or a power converter of this kind.

Power converters for converting electrical energy generate power loss, which manifests as heat loss. This heat then has to be discharged from the corresponding component parts in order to protect them from damage. In a power converter, power loss occurs in the power unit in particular. There, different electrical components are used which warm up during operation due to electrical losses and have to be cooled in order to be able to ensure a required service life of the components. In essence, these are the semiconductors (e.g. IGBTs) and the intermediate circuit capacitors. As the service life of intermediate circuit capacitors is greatly influenced by the ambient temperature, these should not exceed approx. 70° C. in order to be able to use standard components. These standard components are available on the market at a favorable price and do not have negative effects on low manufacturing costs of the power converter.

Due to the low permissible ambient temperature for the intermediate circuit capacitors, there is a specification with regard to the arrangement in an air-cooled power unit. Here, the intermediate circuit capacitors are arranged in an air stream for cooling, either before the semiconductors or by means of an air bypass. This ensures that they are supplied with cool, i.e. not pre-warmed, cooling air.

The object underlying the invention is that of improving a cooling system for a power converter.

SUMMARY OF THE INVENTION

This object is achieved by a cooling system for a power converter, including a first cooling channel, a second cooling channel, wherein the first and the second cooling channel are arranged in parallel, at least in sections, wherein in the region of the parallel arrangement the first cooling channel is embodied for the cooling of semiconductors of the power converter, wherein in the region of the parallel arrangement the second cooling channel is embodied for the cooling of intermediate circuit capacitors of the power converter, wherein the cooling channels are embodied as air channels, and wherein the cooling system has an air distributor, wherein the air distributor is embodied so as to divide the air stream between the first cooling channel and the second cooling channel in the ratio in a range of 80:20 to 95:5.

The object is further achieved by a power converter with a cooling system of this kind. Furthermore, the object is achieved by a method for regulating and/or controlling a cooling system of this kind or the like.

Advantageous embodiments of the invention are specified in the dependent claims.

The invention is based on the knowledge that a good supply of sufficiently cooled cooling medium, for example of air or water, can be achieved by a parallel arrangement of two cooling channels for the cooling of intermediate circuit capacitors and semiconductors in the device. The semiconductors are also referred to as power semiconductors due to the high switchable currents. For this purpose, directly inflowing and hermetically separated cooling channels are provided for these two different components. By way of the two cooling channels, both intermediate circuit capacitors and the semiconductors are cooled by a cooling medium which has not been pre-warmed. For the intermediate circuit capacitors, this has the advantage that permissible maximum temperatures can be complied with in a reliable manner. At the same time, it is possible to reliably discharge the considerably higher power loss of the semiconductors. The parallel arrangement makes it possible here to avoid a mutual influencing in a simple manner. In addition to the thermal advantages, the two cooling channels also make it possible to achieve a relatively simple, low-inductance device structure with very simple power rails for conducting current for the DC and AC rails. Due to this arrangement, the structural volume of the overall device can be very compact in design.

In this context, the cooling channels are embodied as air channels. The use of air has proven particularly advantageous. This can be taken from the surrounding environment and supplied to the components to be cooled by means of the cooling channels. This makes it possible to divide the cooling air across two parallel cooling channels in an unproblematic manner. In contrast to cooling with water as cooling medium, it is possible to dispense with a heat exchanger, which emits the heat in the water to the surrounding environment. This makes it possible to implement a cooling system which has a particularly simple structure and simultaneously is highly effective.

Here, the cooling system has an air distributor, wherein the air distributor is embodied in such an advantageous manner, so as to divide the air stream between the first cooling channel and the second cooling channel in a 90:10 ratio. As the intermediate circuit capacitors need as low a temperature of the cooling medium as possible, but the power loss in the semiconductors is considerably greater than in the intermediate circuit capacitors, it has proven advantageous to divide the overall air stream in the ratio of 90:10 (air quantity for semiconductors in relation to intermediate circuit capacitors) via an air distributor. Investigations have found that divisions in the range of 80:20 to 95:5 bring good and primarily even cooling results.

For this purpose, it is advantageous if a measurement value of a temperature is used for dividing the cooling air across the first and the second cooling channel. The cooling system has a temperature sensor for this purpose. This temperature measurement value can be used directly or after being processed, for example after being calculated in a temperature model, for the regulation or control of dividing the air between the two cooling channels. Here, the temperature sensor may measure a temperature of a component to be cooled situated in the cooling air channel, for example. As an alternative or in addition, it is also possible to measure the temperature of the cooling air, in particular the exhaust air, i.e. once it has absorbed heat from the components to be cooled, and use this for the regulation or control of the division.

The advantage of dividing the air as a function of a temperature measurement value lies in that the components to be cooled in the two air channels can be cooled optimally according to operating conditions. In this context, for example, the division can be adjusted such that the loss of service life due to the components to be cooled heating up is made uniform. As an alternative or in addition, it is possible to regulate or control both the quantity of air and the division of the air hi such a way that the temperature of the components to be cooled assumes a reference value and remains at this value during operation. By avoiding temperature fluctuations, the service life of the components to be cooled is increased.

In a further advantageous embodiment of the invention, the cooling system has precisely one fan, which is arranged such that it generates cooling air streams in the first and in the second cooling channel. In this embodiment, all the cooling air required for both cooling channels can be led to the intermediate circuit capacitors and the semiconductors by only one fan. Here, the fan generates cooling air streams both in the first and in the second cooling channel. In this context, the cooling air required is blown by the fan into the two cooling channels.

In this context, the air distributor may have openings of different sizes for dividing the air across the two cooling channels, so that the corresponding division ratio is produced. As an alternative or in addition, these openings may be equipped with movable flaps, which can be used to adjust the ratio of the division. The advantage of the adjustment lies in that it is possible to respond to different power loss divisions, for example depending on the operating point of the power converter, and it is possible to design the cooling optimally for both components. The division may also for example be controlled or regulated as a function of the temperature of the intermediate circuit capacitors and/or the semiconductors.

A further possibility for carrying out the division of air across the two cooling channels is to provide a means for reducing the pressure for at least one of the cooling channels. This likewise makes it possible to influence the division of the quantity of cooling air across the two cooling channels in a simple manner.

In a further advantageous embodiment of the invention, the first and the second cooling channel are arranged spatially in parallel in the region of the parallel arrangement. In the spatially parallel arrangement, the outer shell of the first cooling channel extends in parallel with the outer shell of the second cooling channel, at least in sections. By way of the spatially parallel arrangement, it is also possible to arrange the intermediate circuit capacitors and the semiconductors in parallel with one another in the power converter. This also makes it possible, with regard to the electrical behavior, to achieve a particularly simple and low-inductance device structure with very simple power rails for conducting current for the DC and AC rails. Due to this arrangement, the structural volume of the power converter can be very compact and therefore cost-effective in design.

BRIEF DESCRIPTION OF THE DRAWING

The invention is described and explained in more detail below on the basis of the exemplary embodiments shown in the figures, in which.

DETAILED DESCRIPTION OF PREFERRED EMBODIMENTS

Figure 1:
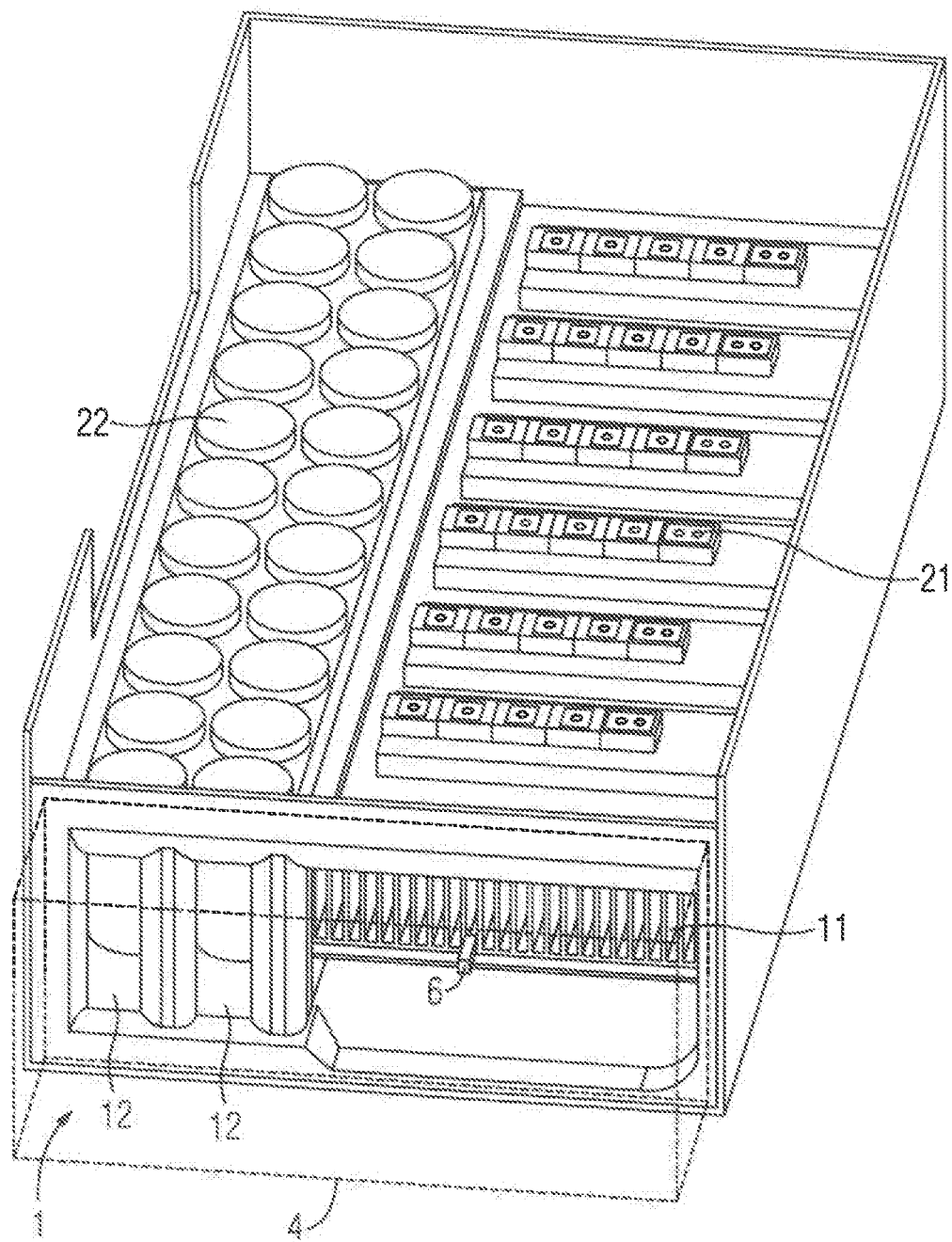
FIG. 1 shows two cooling channels of a power converter.

FIG. 1 shows a cooling system 1 for using air as the cooling medium. This cooling system 1 has a first cooling channel 11 and a second cooling channel 12. These extend spatially in parallel through the cutout of the power converter 2 shown. It is possible to clearly see the separated cooling channels for the cooling of the semiconductors 21 and the cooling of the intermediate circuit capacitors 22. In this context, the first cooling channel 11 serves the cooling of the semiconductors 21 which are installed on a cooling element. The cooling ribs of the cooling element protrude into the first cooling channel 11. The semiconductors 21 thus emit the heat generated by power loss to the cooling medium of air by way of the cooling element. It is thus possible to avoid an overheating of the semiconductors 21 in a reliable manner.

The intermediate circuit capacitors 22 are arranged in the second cooling channel 12. These are situated in the second cooling channel 12 and the air flows around them as cooling medium. In this context, the intermediate circuit capacitors 22 emit the heat which has arisen due to losses in the capacitors. As the power loss of the semiconductors 21 is greater than that of the intermediate circuit capacitors 22, the effective cross-sectional area of the first cooling channel 11 is greater than the effective cross-sectional area of the second cooling channel 12. The effective cross-sectional area is the cross-sectional area of the cooling channel 11, 12 minus the components protruding therein, such as intermediate circuit capacitors 22 or cooling ribs.

An air distributor 4 (shown in FIG. 1 by broken line) at the input of the two cooling channels 11, 12 serves to control the air division between the two cooling channels 11, 12. Using this, for example as a function of the operating point and/or the temperatures measured at the semiconductors 2. e.g. via a temperature sensor 6, and/or the intermediate circuit capacitors 22, it is possible to control or regulate the division of the cooling air across the two cooling channels 11, 12.

Figure 2:
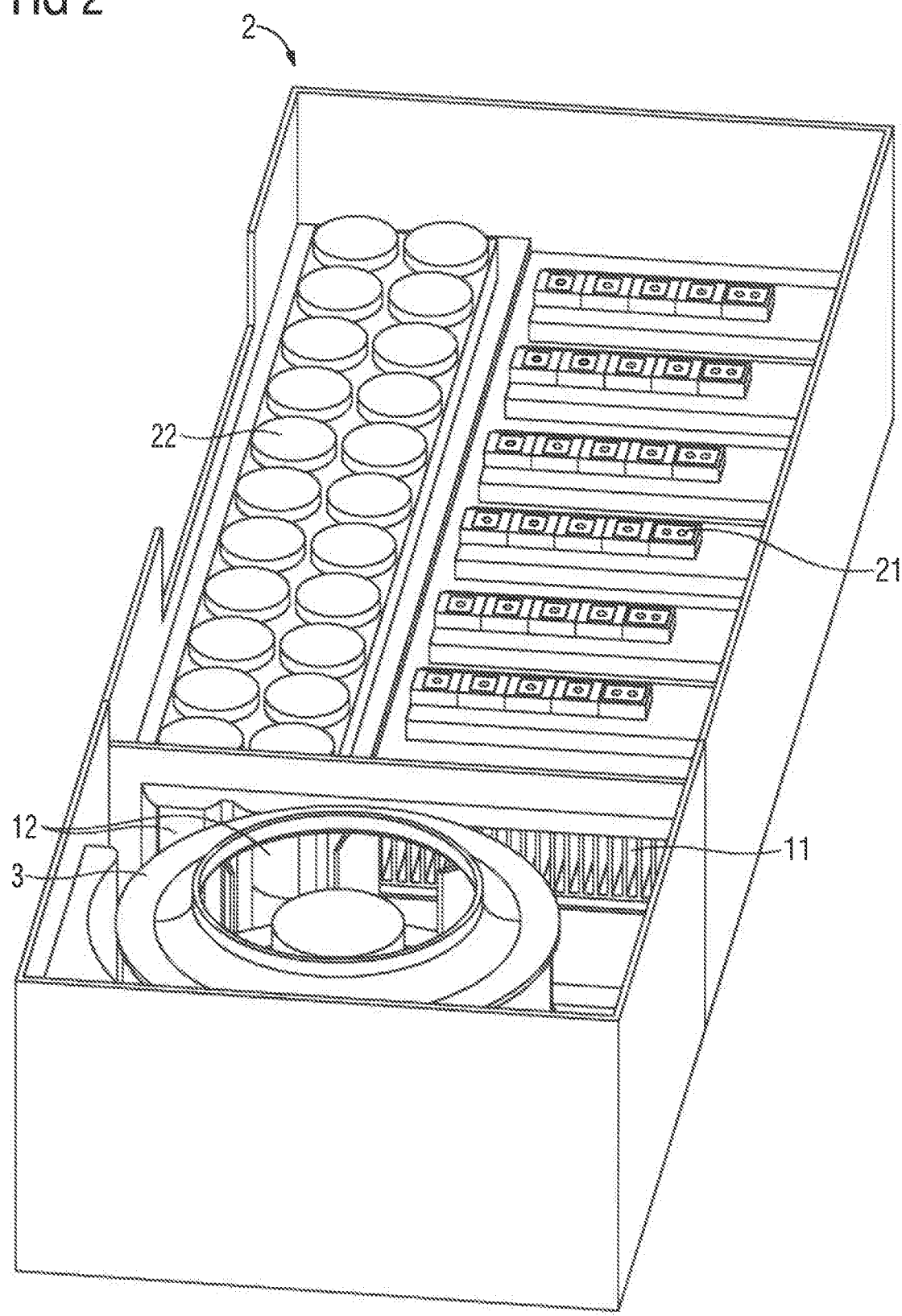
FIG. 2 shows a power converter.

FIG. 2 shows a power converter 2 with a cooling system 1. For the avoidance of repetition, reference is made to the description relating to FIG. 1 and the reference characters therein. In order to generate a cooling air stream, the power converter 2 has a fan 3. By way of the air distributor 4, a cooling air stream is generated by the fan 3 both in the first cooling channel 11 and in the second cooling channel 12.

Figure 3:
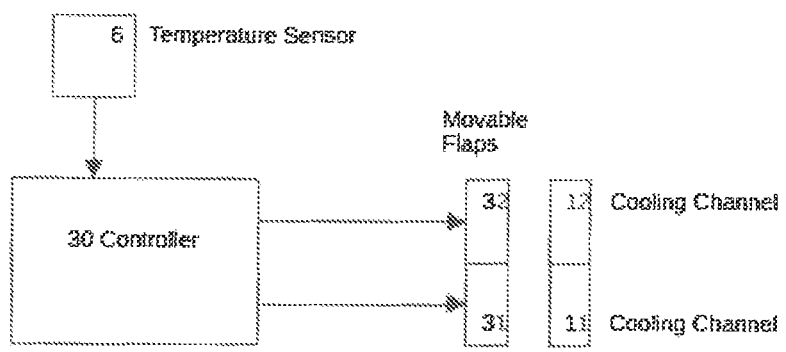
FIG. 3 shows a schematic diagram of the control of the cooling system.

FIG. 3 shows a schematic diagram of the control of the cooling system 1. A controller 30 is operatively coupled to the temperature sensor 6 and movable flaps 31 and 32. For this purpose, it is advantageous if a measurement value of a temperature is used for dividing the cooling air across the first 11 and the second 12 cooling channel. The cooling system 1 has a temperature sensor 6 for this purpose. This temperature measurement value can be used directly or after being processed by the controller 30, for example after being calculated in a temperature model, for the regulation or control of dividing the air between the two cooling channels 11 and 12 by control of the movable flaps 31 and 32. In this context, the air distributor 4 may have openings of different sizes for dividing the air across the two cooling channels 11 and 12, so that the corresponding division ratio is produced. As an alternative or in addition, these openings may be equipped with movable flaps 31 and 32, which can be used to adjust the ratio of the division. The advantage of the adjustment lies in that it is possible to respond to different power loss divisions, for example depending on the operating point of the power converter 2, and it is possible to design the cooling optimally for both components. The division may also for example be controlled or regulated as a function of the temperature of the intermediate circuit capacitors 22 and/or the semiconductors 21.

In summary, the invention relates to a cooling system for a power converter. In order to improve the cooling system, it is proposed to equip the cooling system with a first cooling channel and a second cooling channel, wherein the first and the second cooling channel are arranged in parallel, at least in sections, wherein in the region of the parallel arrangement the first cooling channel is embodied for the cooling of semiconductors of the power converter, wherein in the region of the parallel arrangement the second cooling channel is embodied for the cooling of intermediate circuit capacitors of the power converter. The invention further relates to a power converter with a cooling system of this kind.

What is claimed is:

1. A cooling system for a power converter, said cooling system comprising:
    a first cooling channel configured to form an air channel having an opening equipped with movable flaps;
    a second cooling channel configured to form an air channel having an opening with movable flaps, said first and second cooling channels having at least one section in which the first and second cooling channels extend in a parallel arrangement in which the first cooling channel cools semiconductors of the power converter and the second cooling channel cools intermediate circuit capacitors of the power converter with said openings having different sizes such that said first cooling channel has an effective cross-sectional area greater than an effective cross-sectional area of the second cooling channel;
    a temperature sensor generating a measurement value;
    a controller operatively coupled to the temperature sensor and the movable flaps and controlling the movable flaps as a function of the measurement value of the temperature sensor; and
    an air distributor configured to divide an air stream between the first cooling channel and the second cooling channel in a division ratio with the openings and adjusting the division ratio with the movable flaps in a range of 80:20 to 95:5 as a function of the measurement value of the temperature sensor.

2. The cooling system of claim 1, further comprising a single fan arranged to generate a cooling air stream in the first cooling channel and a cooling air stream in the second cooling channel.

3. The cooling system of claim 1, wherein the first and second cooling channels are arranged spatially in parallel in a region of the parallel arrangement.

4. A power converter, comprising:
    semiconductors;
    intermediate circuit capacitors; and
    a cooling system comprising a first cooling channel configured to form an air channel having an opening equipped with movable flaps, a second cooling channel configured to form an air channel having an opening equipped with movable flaps, said first and second cooling channels having at least one section in which the first and second cooling channels extend in a parallel arrangement in which the first cooling channel cools the semiconductors of the power converter and the second cooling channel cools the intermediate circuit capacitors of the power converter with said openings having different sizes such that said first cooling channel has an effective cross-sectional area greater than an effective cross-sectional area of the second cooling channel, a temperature sensor generating a measurement value, a controller operatively coupled to the temperature sensor and the movable flaps and controlling the movable flaps as a function of the measurement value of the temperature sensor and an air distributor configured to divide an air stream between the first cooling channel and the second cooling channel in a division ratio with the openings and adjusting the division ratio with the movable flaps in a range of 80:20 to 95:5 as a function of the measurement value of the temperature sensor.

5. The power converter of claim 4, wherein the cooling system comprises a single fan arranged to generate a cooling air stream in the first cooling channel and a cooling air stream in the second cooling channel.

6. The power converter of claim 4, wherein the first and second cooling channels are arranged spatially in parallel in a region of the parallel arrangement.

7. A method for regulating and/or controlling a cooling system for a power converter, said method comprising:
    placing a temperature sensor such as to generate a measurement value;
    dividing an air stream into a first cooling channel having an opening equipped with movable flaps and a second cooling channel having an opening equipped with movable flaps of the cooling system with said openings having different sizes such that said first cooling channel has an effective cross-sectional area greater than an effective cross-sectional area of the second cooling channel;
    controlling the movable flaps with a controller as a function of the measurement value of the temperature sensor;
    dividing the air stream with an air distributor between the first cooling channel and the second cooling channel in a division ratio; and
    adjusting the division ratio with the movable flaps in a range of 80:20 to 95:5 as a function of the measurement value of the temperature sensor.

8. The method of claim 7, wherein the measurement value as generated by the temperature sensor is a temperature of a component of the power converter in the first and second channels.

9. The method of claim 7, wherein the component is a semiconductor or an intermediate circuit capacitor.

10. The method of claim 7, wherein the measurement value as generated by the temperature sensor is a temperature of cooling air in the first and second channels.

11. The method of claim 7, further comprising generating the air stream by a single fan.

* * * * *